United States Patent
Cui et al.

(10) Patent No.: US 11,573,879 B2
(45) Date of Patent: Feb. 7, 2023

(54) ACTIVE ASSET MONITORING

(71) Applicant: General Electric Company, Schenectady, NY (US)

(72) Inventors: Fangfang Cui, Mason, OH (US); Kreig Phillip Dreier, West Chester, OH (US); Cristina McKnight, Cincinnati, OH (US); Caleb Crouse, Arlington, VA (US)

(73) Assignee: General Electric Company, Schenectady, NY (US)

( * ) Notice: Subject to any disclaimer, the term of this patent is extended or adjusted under 35 U.S.C. 154(b) by 339 days.

(21) Appl. No.: 16/166,739

(22) Filed: Oct. 22, 2018

(65) Prior Publication Data

US 2020/0125470 A1 Apr. 23, 2020

(51) Int. Cl.
*G06F 11/34* (2006.01)
*G06N 20/00* (2019.01)
*G01R 21/133* (2006.01)
*G06F 9/54* (2006.01)
*G06K 9/62* (2022.01)
*G06N 3/08* (2006.01)

(52) U.S. Cl.
CPC ........ *G06F 11/3452* (2013.01); *G01R 21/133* (2013.01); *G06F 9/542* (2013.01); *G06F 11/3495* (2013.01); *G06K 9/6201* (2013.01); *G06N 3/08* (2013.01); *G06N 20/00* (2019.01)

(58) Field of Classification Search
CPC .. G06F 11/3452; G06F 9/542; G06F 11/3495; G06N 20/00; G01R 21/133; G06K 9/6201
USPC ........................................................ 702/186
See application file for complete search history.

(56) References Cited

U.S. PATENT DOCUMENTS

| 5,602,761 A | * | 2/1997 | Spoerre | G01H 1/003 702/179 |
| 7,714,735 B2 | * | 5/2010 | Rockwell | G01R 19/2513 340/635 |
| 8,725,667 B2 | | 5/2014 | Kaushal et al. | |

(Continued)

FOREIGN PATENT DOCUMENTS

| CA | 2 927 826 A1 | 10/2017 | | |
| EP | 3 255 581 A1 | 12/2017 | | |
| FI | 126901 B | * | 7/2017 | G01R 31/3193 |

OTHER PUBLICATIONS

Sniezynski, B. M. (Sep. 2014). Integration of inference and machine learning as a tool for creative reasoning. In 2014 AAAI Fall Symposium Series. (Year: 2014).*

(Continued)

*Primary Examiner* — Eman A Alkafawi
*Assistant Examiner* — Aeysha N Sultana
(74) *Attorney, Agent, or Firm* — Fitch, Even, Tabin & Flannery LLP

(57) ABSTRACT

Systems and techniques for active asset monitoring are presented. A system can collect a set of voltage measurements from one or more assets. The system can also perform learning associated with the set of voltage measurements and generate a set of digital signatures that includes a set of patterns regarding the set of voltage measurements. Furthermore, the system can determine monitor performance of an asset based on the set of digital signatures that includes the set of patterns regarding the set of voltage measurements.

15 Claims, 10 Drawing Sheets

(56) References Cited

U.S. PATENT DOCUMENTS

| | | | |
|---|---|---|---|
| 9,251,033 B2 | 2/2016 | Kirchhofer | |
| 9,255,969 B2 | 2/2016 | Basu et al. | |
| 9,411,326 B2 | 8/2016 | Tiwari et al. | |
| 9,960,598 B2 | 5/2018 | Asati et al. | |
| 9,977,425 B1 | 5/2018 | McCann et al. | |
| 2004/0230383 A1* | 11/2004 | Bechhoefer | G01R 31/11 702/57 |
| 2005/0141753 A1* | 6/2005 | Bartram | G06K 9/00154 382/119 |
| 2007/0035398 A1* | 2/2007 | Vesel | G05B 23/0216 340/572.1 |
| 2010/0051588 A1 | 3/2010 | Li et al. | |
| 2011/0022240 A1 | 1/2011 | Rajapaske | |
| 2014/0337277 A1* | 11/2014 | Asenjo | G06Q 10/06 707/603 |
| 2017/0032281 A1 | 2/2017 | Hsu | |
| 2017/0161130 A1* | 6/2017 | Goldstein | G06Q 10/20 |
| 2017/0364043 A1 | 12/2017 | Ganti et al. | |
| 2020/0011908 A1* | 1/2020 | Bickel | H02J 13/0006 |

OTHER PUBLICATIONS

Salahshoor, Karim, Majid Soleimani Khoshro, and Mojtaba Kordestani. "Fault detection and diagnosis of an industrial steam turbine using a distributed configuration of adaptive neuro-fuzzy inference systems." Simulation Modelling Practice and Theory 19.5 (2011): 1280-1293. (Year: 2011).*

Extended European Search Report received for European Patent Application Serial No. 19203266.2 dated Feb. 24, 2020, 09 pages.

Communication pursuant to Rule 69 EPC received for European Patent Application Serial No. 19203266.2 dated May 6, 2020, 02 pages.

* cited by examiner

ACTIVE ASSET MONITORING

TECHNICAL FIELD

This disclosure relates generally to asset management systems, and more specifically, to an analytics system for one or more assets.

BACKGROUND

Generally, it is difficult to manage maintenance of assets in a system. For example, today's industries generally employ maintenance plans where an asset is fixed after it is determined that the asset is broken. As such, conventional maintenance plans for an asset generally lead to decreased performance of the asset, increased downtime for the asset, and increased costs for the asset. As such, it is desirable to improve management of an asset and/or to improve a maintenance plan for an asset.

SUMMARY

The following presents a simplified summary of the specification in order to provide a basic understanding of some aspects of the specification. This summary is not an extensive overview of the specification. It is intended to neither identify key or critical elements of the specification, nor delineate any scope of the particular implementations of the specification or any scope of the claims. Its sole purpose is to present some concepts of the specification in a simplified form as a prelude to the more detailed description that is presented later.

According to an embodiment, a system includes a data collection, an artificial intelligence component, and a monitoring component. The data collection component collects a set of voltage measurements from one or more assets. The artificial intelligence component performs learning associated with the set of voltage measurements and generates a set of digital signatures that includes a set of patterns regarding the set of voltage measurements. The monitoring component monitors performance of an asset based on the set of digital signatures that includes the set of patterns regarding the set of voltage measurements.

According to an embodiment, a method provides for collecting, by a system comprising a processor, a set of voltage measurements from one or more assets. The method also provides for performing, by the system, learning associated with the set of voltage measurements using one or more artificial intelligence techniques. Furthermore, the method provides for generating, by the system, a set of digital signatures that includes a set of patterns regarding the set of voltage measurements. The method also provides for monitoring, by the system, performance of an asset based on the set of digital signatures that includes the set of patterns regarding the set of voltage measurements.

According to another embodiment, a computer readable storage device comprises instructions that, in response to execution, cause a system comprising a processor to perform operations, comprising: collecting a set of voltage measurements from one or more assets, performing learning associated with the set of voltage measurements using one or more artificial intelligence techniques, generating a set of digital signatures that includes a set of patterns regarding the set of voltage measurements, and monitoring performance of an asset based on the set of digital signatures that includes the set of patterns regarding the set of voltage measurements.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, implementations, objects and advantages of the present invention will be apparent upon consideration of the following detailed description, taken in conjunction with the accompanying drawings, in which like reference characters refer to like parts throughout, and in which.

DETAILED DESCRIPTION

Figure 1:
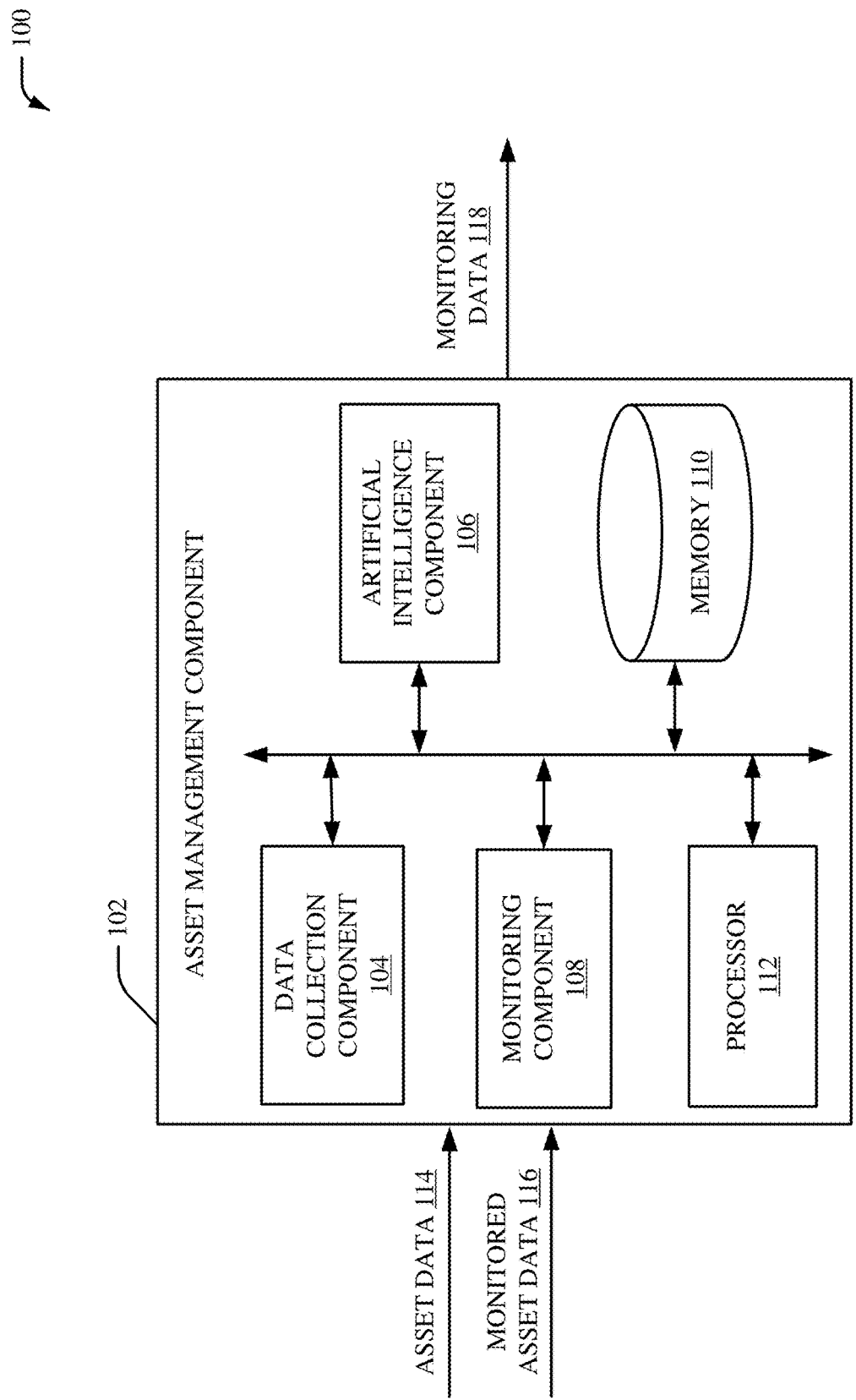
FIG. 1 illustrates a block diagram of an example, non-limiting system that includes an asset management component in accordance with one or more embodiments described herein.

Various aspects of this disclosure are now described with reference to the drawings, wherein like reference numerals are used to refer to like elements throughout. In the following description, for purposes of explanation, numerous specific details are set forth in order to provide a thorough understanding of one or more aspects. It should be understood, however, that certain aspects of this disclosure may be practiced without these specific details, or with other methods, components, materials, etc. In other instances, well-known structures and devices are shown in block diagram form to facilitate describing one or more aspects.

Systems and techniques for active asset monitoring are presented. In an aspect, measurements of key process variables from one or more assets can be utilized to identify leading indicators of performance degradation for an asset. Furthermore, one or more thresholds can be set based on historical process failures to prevent asset performance from dropping below critical thresholds and/or to create automated maintenance work orders for the asset while also improving capacity and/or yield of the asset. In another aspect, advance notice that a process associated with an asset is drifting beyond healthy operating conditions can be provided before the drift results in an increased rate of rework and/or loss of performance for the asset. Machine data from one or more assets can be compared to identify one or more trends. Furthermore, additional machine data can be employed to identify digital fingerprints (e.g., digital signatures) that identify a cause of the one or more trend for the asset. In an embodiment, voltage data (e.g., a set of voltage measurements) from one or more assets can be compared to identify one or more trends. Furthermore, additional voltage data (e.g., additional voltage measurements) can be employed to identify digital fingerprints (e.g., digital signatures) that identify a cause of the one or more trends for the asset. In a non-limiting example, machine data (e.g., voltage data) from each hole of each asset from a set of assets can be compared to identify one or more trends and additional machine data (e.g., additional voltage data) can be employed to identify digital fingerprints (e.g., digital signatures) that identify what a cause of the one or more trends. In certain embodiments, analytics and/or visualization associated with the active asset monitoring can be provided. As such, nonconformance risks for the asset can be reduced by maintaining an asset and/or a process for an asset within healthy operational conditions. Furthermore, accuracy and/or a number of identified issues for an asset can be improved. Troubleshooting for an asset and/or performance of an asset can also be improved. An amount of time between maintenance procedures for an asset can also be maximized.

Referring initially to FIG. 1, there is illustrated an example system 100 that provides active asset monitoring, in accordance with one or more embodiments described herein. The system 100 can be implemented on or in connection with a network of servers associated with an enterprise application. The system 100 can be employed by various systems, such as, but not limited to asset systems, equipment systems, aviation systems, engine systems, aircraft systems, automobile systems, water craft systems, industrial equipment systems, industrial systems, manufacturing systems, factory systems, energy management systems, power grid systems, water supply systems, transportation systems, healthcare systems, refinery systems, media systems, financial systems, data-driven prognostics systems, diagnostics systems, digital systems, asset management systems, machine learning systems, neural network systems, network systems, computer network systems, communication systems, enterprise systems, and the like. In one example, the system 100 can be associated with a Platform-as-a-Service (PaaS) and/or an asset performance management system. In another example, the system 100 can be a digital prognostics system. Moreover, the system 100 and/or the components of the system 100 can be employed to use hardware and/or software to solve problems that are highly technical in nature (e.g., related to machine learning, related to digital data processing prognostics, related to digital data analytics, etc.), that are not abstract and that cannot be performed as a set of mental acts by a human.

The system 100 includes an asset management component 102. In FIG. 1, the asset management component 102 can include a data collection component 104, an artificial intelligence component 106, and/or a monitoring component 108. Aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. The system 100 (e.g., the asset management component 102) can include memory 110 for storing computer executable components and instructions. The system 100 (e.g., the asset management component 102) can further include a processor 112 to facilitate operation of the instructions (e.g., computer executable components and instructions) by the system 100 (e.g., the asset management component 102).

The asset management component 102 (e.g., the data collection component 104 of the asset management component 102) can receive asset data 114. For instance, the data collection component 104 can collect the asset data 114. The asset data 114 can be received from one or more databases (e.g., a network of databases). For example, the asset data 114 can be associated with data stored on a network of servers. The asset data 114 can also be a corpus of stored data generated by and/or associated with one or more assets. For example, the asset data 114 can be generated by and/or associated with one or more assets, one or more devices, one or more machines and/or one or more types of equipment. The asset data 114 can be, for example, time-series data. The asset data 114 can also be, for example, parametric data that includes one or more parameters and corresponding data values. The asset data 114 can include various data, such as but not limited to, sensor data, machine data, voltage data, process data (e.g., process log data), operational data, monitoring data, maintenance data, parameter data, measurement data, performance data, industrial data, machine data, asset data, equipment data, device data, meter data, real-time data, historical data, audio data, image data, video data, and/or other data. The asset data 114 can also be encoded data, processed data and/or raw data. In an embodiment, the asset data 114 can include voltage data (e.g., a set of voltage measurements) generated by one or more assets. In a non-limiting example, the asset data 114 can be voltage data (e.g., a set of voltage measurements) gathered from one or more electric discharge machines. For instance, voltage data (e.g., a set of voltage measurements) can be gathered from one or more portions of each asset (e.g., each hole of each asset from a set of assets). However, it is to be appreciated that the asset data 114 can be associated with a different system such as, but not limited to a different asset system, a different equipment systems, a different aviation systems, a different aircraft systems, an automobile system, a water craft system, an industrial equipment system, an industrial system, a manufacturing system, a factory system, an energy management system, a power grid system, a water supply system, a transportation system, a healthcare system, a refinery system, a media system, a financial system, a data-driven prognostics system, a diagnostics system, a digital system, an asset management system, a machine learning system, a neural network system, a network system, a computer network system, a communication system, an enterprise system, etc.

The artificial intelligence component 106 can perform learning associated with the asset data 114. Furthermore, the artificial intelligence component 106 can also generate a set of digital signatures that includes a set of patterns regarding the asset data 114. For example, to facilitate detection of one or more future events for an asset, the artificial intelligence component 106 can learn the set of digital signatures. The artificial intelligence component 106 can also generate inferences regarding the set of digital signatures. In an embodiment, the artificial intelligence component 106 can perform learning associated with voltage data (e.g., a set of voltage measurements) included in the asset data 114. Furthermore, the artificial intelligence component 106 can also generate a set of digital signatures that includes a set of patterns regarding the voltage data (e.g., the set of voltage measurements). However, it is to be appreciated that the artificial intelligence component 106 can additionally or alternatively perform learning associated with other data (e.g., sensor data, machine data, process data (e.g., process log data), operational data, monitoring data, maintenance data, parameter data, measurement data, performance data, industrial data, machine data, asset data, equipment data, device data, meter data, real-time data, historical data, audio data, image data, video data, and/or other data) included in the asset data 114. The artificial intelligence component 106 can employ principles of artificial intelligence to facilitate learning and/or generating inferences associated with the asset data 114. The artificial intelligence component 106 can perform learning associated with the asset data 114 explicitly or implicitly. The learning and/or generated inferences by the artificial intelligence component 106 can facilitate identification and/or classification of different patterns associated with the asset data 114. The artificial intelligence component 106 can also employ an automatic classification system and/or an automatic classification process to facilitate learning and/or generating inferences associated with the asset data 114. For example, the artificial intelligence component 106 can employ a probabilistic and/or statistical-based analysis (e.g., factoring into the analysis utilities and costs) to learn and/or generate inferences associated with the asset data 114. The artificial intelligence component 106 can employ, for example, a support vector machine (SVM) classifier to learn and/or generate inferences associated with the asset data 114. Additionally or alternatively, the artificial intelligence component 106 can employ other classification techniques associated with Bayesian networks, decision trees and/or probabilistic classification models. Classifiers employed by the artificial intelligence component 106 can be explicitly trained (e.g., via a generic training data) as well as implicitly trained (e.g., via observing user behavior, receiving extrinsic information). For example, with respect to SVM's that are well understood, SVM's are configured via a learning or training phase within a classifier constructor and feature selection module. A classifier is a function that maps an input attribute vector, $x=(x1, x2, x3, x4, xn)$, to a confidence that the input belongs to a class—that is, $f(x)$=confidence (class). The artificial intelligence component 106 can also employ, in certain embodiments, historical data associated with the asset data 114 to facilitate learning and/or generating inferences associated with the asset data 114.

In an aspect, the artificial intelligence component 106 can include an inference component that can further enhance automated aspects of the artificial intelligence component 106 utilizing in part inference-based schemes to facilitate learning and/or generating inferences associated with the asset data 114. The artificial intelligence component 106 can employ any suitable machine-learning based techniques, statistical-based techniques and/or probabilistic-based techniques. For example, the artificial intelligence component 106 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the artificial intelligence component 106 can perform a set of machine learning computations associated with the asset data 114. For example, the artificial intelligence component 106 can perform a set of clustering machine learning computations, a set of decision tree machine learning computations, a set of instance-based machine learning computations, a set of regression machine learning computations, a set of regularization machine learning computations, a set of rule learning machine learning computations, a set of Bayesian machine learning computations, a set of deep Boltzmann machine computations, a set of deep belief network computations, a set of convolution neural network computations, a set of stacked auto-encoder computations and/or a set of different machine learning computations. The set of digital signatures determined by the artificial intelligence component 106 can be stored, for example, in a digital signature library and/or a database.

A data signature from the set of digital signatures can represent a subset of the asset data 114. Furthermore, a digital signature from the set of digital signatures can be a digital fingerprint data that represents a digital pattern. For example, a digital signature from the set of digital signatures can be a digital fingerprint that comprises digital fingerprint data (e.g., a string of bits) associated with a portion of the asset data 114. A digital signature from the set of digital signatures can also include a set of data values (e.g., a set of measurements) over a defined period of time. In an aspect, a data signature from the set of digital signatures can represent a digital fingerprint for an event. For example, a data signature from the set of digital signatures can represent a digital fingerprint for a failure event associated with a failure condition. Furthermore, a digital signature from the set of digital signatures can uniquely identify and/or convey a portion of the asset data 114. For example, a digital signature from the set of digital signatures can be a data element that encodes a portion of the asset data 114. Moreover, a digital signature from the set of digital signatures can represent a digital pattern for a portion of the asset data 114. For instance, a digital signature from the set of digital signatures can be generated based on physical characteristics of the asset data 114 such as peaks in the asset data 114, troughs in the asset data 114, speed of change associated with the asset data 114, a length of time between a first peak in the asset data 114 and a second peak in the asset data 114, and/or other graphical characteristics of the asset data 114. As such, a digital signature from the set of digital signatures can convey trends (e.g., graphical trends) and/or predict anomalies in the asset data 114. In an embodiment, the artificial intelligence component 106 can employ one or more digital fingerprinting techniques (e.g., one or more digital fingerprint algorithms) to map the asset data 114 into the set of digital signatures. For example, the artificial intelligence component 106 can employ a hash technique to generate the set of digital signatures for the asset data 114. In another example, the artificial intelligence component 106 can employ a locality sensitive hashing technique to generate the set of digital signatures for the asset data 114. In yet example, the artificial intelligence component 106 can employ a random hashing technique to generate the set of digital signatures for the asset data 114. However, it is to be appreciated that other types of digital fingerprinting techniques and/or hashing techniques can be employed to generate the set of digital signatures for the asset data 114.

The monitoring component 108 can monitor performance of an asset (e.g., a monitored asset) based on the set of digital signatures that includes the set of patterns regarding the asset data 114. In an embodiment, the asset management component 102 (e.g., the monitoring component 108 of the asset management component 102) can receive monitored asset data 116. For instance, the monitoring component 108 can monitor an asset to collect the monitored asset data 116. In an embodiment, the monitored asset data 116 can be received from one or more databases (e.g., a network of databases). For example, the monitored asset data 116 can be generated by an asset and stored in one or more databases. In another embodiment, the monitored asset data 116 can be received directly from an asset in approximately real-time. The monitored asset data 116 can be generated by an asset that generates at least a portion of the asset data 114. Alternatively, the monitored asset data 116 can be generated by an asset that is different than one or more assets that generate the asset data 114. The asset associated with the monitored asset data 116 can be one or more assets, one or more devices, one or more machines and/or one or more types of equipment. The monitored asset data 116 can be, for example, time-series data. The monitored asset data 116 can also be, for example, parametric data that includes one or more parameters and corresponding data values. The monitored asset data 116 can include various data, such as but not limited to, sensor data, machine data, voltage data, process data (e.g., process log data), operational data, monitoring data, maintenance data, parameter data, measurement data, performance data, industrial data, machine data, asset data, equipment data, device data, meter data, real-time data, historical data, audio data, image data, video data, and/or other data. The monitored asset data 116 can also be encoded data, processed data and/or raw data. In an embodiment, the monitored asset data 116 can include voltage data (e.g., a set of voltage measurements) generated by an asset. In a non-limiting example, the monitored asset data 116 can be voltage data (e.g., a set of voltage measurements) gathered from an electric discharge machine. For instance, voltage data (e.g., a set of voltage measurements) can be gathered from one or more portions of an asset (e.g., each hole an asset). However, it is to be appreciated that the monitored asset data 116 can be associated with a different system such as, but not limited to a different asset system, a different equipment systems, a different aviation systems, a different aircraft systems, an automobile system, a water craft system, an industrial equipment system, an industrial system, a manufacturing system, a factory system, an energy management system, a power grid system, a water supply system, a transportation system, a healthcare system, a refinery system, a media system, a financial system, a data-driven prognostics system, a diagnostics system, a digital system, an asset management system, a machine learning system, a neural network system, a network system, a computer network system, a communication system, an enterprise system, etc.

In an embodiment, the monitoring component 108 can generate a digital signature associated with the monitored asset data 116. The digital signature associated with the monitored asset data 116 can represent at least a portion of the monitored asset data 116. Furthermore, digital signature associated with the monitored asset data 116 can be a digital fingerprint data that represents a digital pattern. For example, digital signature associated with the monitored asset data 116 can be a digital fingerprint that comprises digital fingerprint data (e.g., a string of bits) associated with at least a portion of the monitored asset data 116. The digital signature associated with the monitored asset data 116 can also include a set of data values (e.g., a set of measurements) over a defined period of time. In an aspect, the digital signature associated with the monitored asset data 116 can uniquely identify and/or convey at least a portion of the monitored asset data 116. For example, the digital signature associated with the monitored asset data 116 can be a data element that encodes at least a portion of the monitored asset data 116. Moreover, the digital signature associated with the monitored asset data 116 can represent a digital pattern for at least a portion of the monitored asset data 116. For instance, the digital signature associated with the monitored asset data 116 can be generated based on physical characteristics of the monitored asset data 116 such as peaks in the monitored asset data 116, troughs in the monitored asset data 116, speed of change associated with the monitored asset data 116, a length of time between a first peak in the monitored asset data 116 and a second peak in the monitored asset data 116, and/or other graphical characteristics of the monitored asset data 116. As such, the digital signature associated with the monitored asset data 116 can be employed to convey trends (e.g., graphical trends) and/or predict anomalies in the monitored asset data 116. In an embodiment, the monitoring component 108 can employ one or more digital fingerprinting techniques (e.g., one or more digital fingerprint algorithms) to map the monitored asset data 116 into the digital signature associated with the monitored asset data 116. For example, the monitoring component 108 can employ a hash technique to generate the digital signature associated with the monitored asset data 116. In another example, the monitoring component 108 can employ a locality sensitive hashing technique to generate the digital signature associated with the monitored asset data 116. In yet example, the monitoring component 108 can employ a random hashing technique to generate the digital signature associated with the monitored asset data 116. However, it is to be appreciated that other types of digital fingerprinting techniques and/or hashing techniques can be employed to generate the digital signature associated with the monitored asset data 116.

In another embodiment, the monitoring component 108 can compare the digital signature associated with the monitored asset data 116 to the set of digital signatures associated with the asset data 114. For instance, the monitoring component 108 can compare the digital signature associated with the monitored asset data 116 to the set of digital signatures associated with the asset data 114 in order to identify one or more matches. For example, after the digital signature associated with the monitored asset data 116 is generated, the monitoring component 108 can compare the digital signature associated with the monitored asset data 116 to the set of digital signatures associated with the asset data 114. In an aspect, a match between the digital signature associated with the monitored asset data 116 to the set of digital signatures associated with the asset data 114 can indicate identification of an event. For example, the monitoring component 108 can identify a future event associated with a particular condition for the asset associated with the monitored asset data 116 based on a comparison between the digital signature associated with the monitored asset data 116 and the set of digital signatures associated with the asset data 114. In another example, the monitoring component 108 can identify a future failure event associated with a failure condition for the asset associated with the monitored asset data 116 based on a comparison between the digital signature associated with the monitored asset data 116 and the set of digital signatures associated with the asset data 114. In another aspect, the monitoring component 108 can compute similarity between the digital signature associated with the monitored asset data 116 and the set of digital signatures associated with the asset data 114. The digital signature associated with the monitored asset data 116 can be determined to match the set of digital signatures associated with the asset data 114 if a pattern of the digital signature associated with the monitored asset data 116 matches a pattern of a digital signature from the set of digital signatures associated with the asset data 114. A match between the digital signature associated with the monitored asset data 116 and the set of digital signatures associated with the asset data 114 can be, for example, approximately an exact match. Alternatively, a match between the digital signature associated with the monitored asset data 116 and the set of digital signatures associated with the asset data 114 can be, for example, a fuzzy match.

In certain embodiments, the monitoring component 108 can compute similarity between the digital signature associated with the monitored asset data 116 and the set of digital signatures associated with the asset data 114 based on learning and/or inferences associated with one or more artificial intelligence techniques. Additionally or alternatively, the monitoring component 108 can compute similarity between the digital signature associated with the monitored asset data 116 and the set of digital signatures associated with the asset data 114 based on one or more pattern recognition techniques and/or one or more statistical techniques. In an aspect, the monitoring component 108 can employ principles of artificial intelligence to facilitate generating inferences and/or computing similarity between the digital signature associated with the monitored asset data 116 and the set of digital signatures associated with the asset data 114. The monitoring component 108 can also employ an automatic classification system and/or an automatic classification process to facilitate generating inferences and/or computing similarity between the digital signature associated with the monitored asset data 116 and the set of digital signatures associated with the asset data 114. For example, the monitoring component 108 can employ a probabilistic and/or statistical-based analysis (e.g., factoring into the analysis utilities and costs) to generate inferences and/or compute similarity between the digital signature associated with the monitored asset data 116 and the set of digital signatures associated with the asset data 114. The monitoring component 108 can employ, for example, a support vector machine (SVM) classifier to generate inferences and/or compute similarity between the digital signature associated with the monitored asset data 116 and the set of digital signatures associated with the asset data 114. Additionally or alternatively, the monitoring component 108 can employ other classification techniques associated with Bayesian networks, decision trees and/or probabilistic classification models. Classifiers employed by the monitoring component 108 can be explicitly trained (e.g., via a generic training data) as well as implicitly trained (e.g., via observing user behavior, receiving extrinsic information). For example, with respect to SVM's that are well understood, SVM's are configured via a learning or training phase within a classifier constructor and feature selection module. A classifier is a function that maps an input attribute vector, x=(x1, x2, x3, x4, xn), to a confidence that the input belongs to a class—that is, f(x)=confidence(class). In an aspect, the monitoring component 108 can include an inference component that can further enhance automated aspects of the monitoring component 108 utilizing in part inference-based schemes to facilitate generating inferences and/or computing similarity between the digital signature associated with the monitored asset data 116 and the set of digital signatures associated with the asset data 114. The monitoring component 108 can employ any suitable machine-learning based techniques, statistical-based techniques and/or probabilistic-based techniques. For example, the monitoring component 108 can employ expert systems, fuzzy logic, SVMs, HMMs, greedy search algorithms, rule-based systems, Bayesian models (e.g., Bayesian networks), neural networks, other non-linear training techniques, data fusion, utility-based analytical systems, systems employing Bayesian models, etc. In another aspect, the monitoring component 108 can perform a set of machine learning computations associated with the asset data 114. For example, the monitoring component 108 can perform a set of clustering machine learning computations, a set of decision tree machine learning computations, a set of instance-based machine learning computations, a set of regression machine learning computations, a set of regularization machine learning computations, a set of rule learning machine learning computations, a set of Bayesian machine learning computations, a set of deep Boltzmann machine computations, a set of deep belief network computations, a set of convolution neural network computations, a set of stacked auto-encoder computations and/or a set of different machine learning computations.

In yet another embodiment, the monitoring component 108 can generate monitoring data 118. The monitoring data 118 can include data generated and/or determined as a result of the monitoring of the asset associated with the monitored asset data 116 by the monitoring component 108. For instance, the monitoring data 118 can include information regarding a performance of the asset associated with the monitored asset data 116. In an aspect, the monitoring data 118 can include information regarding the comparison between the digital signature associated with the monitored asset data 116 and the set of digital signatures associated with the asset data 114. For instance, the monitoring data 118 can include a result of the comparison between the digital signature associated with the monitored asset data 116 and the set of digital signatures associated with the asset data 114. In one example, the monitoring data 118 can include information regarding identification of an event based on the comparison between the digital signature associated with the monitored asset data 116 and the set of digital signatures associated with the asset data 114. In another example, the monitoring data 118 can include information regarding identification of a future event associated with a particular condition for the asset associated with the monitored asset data 116 based on the comparison between the digital signature associated with the monitored asset data 116 and the set of digital signatures associated with the asset data 114. In yet another example, the monitoring data 118 can include information regarding identification of a future failure event associated with a failure condition for the asset associated with the monitored asset data 116 based on the comparison between the digital signature associated with the monitored asset data 116 and the set of digital signatures associated with the asset data 114.

While FIG. 1 depicts separate components in the asset management component 102, it is to be appreciated that two or more components may be implemented in a common component. Further, it can be appreciated that the design of system 100 and/or the asset management component 102 can include other component selections, component placements, etc., to facilitate asset performance management.

Figure 2:
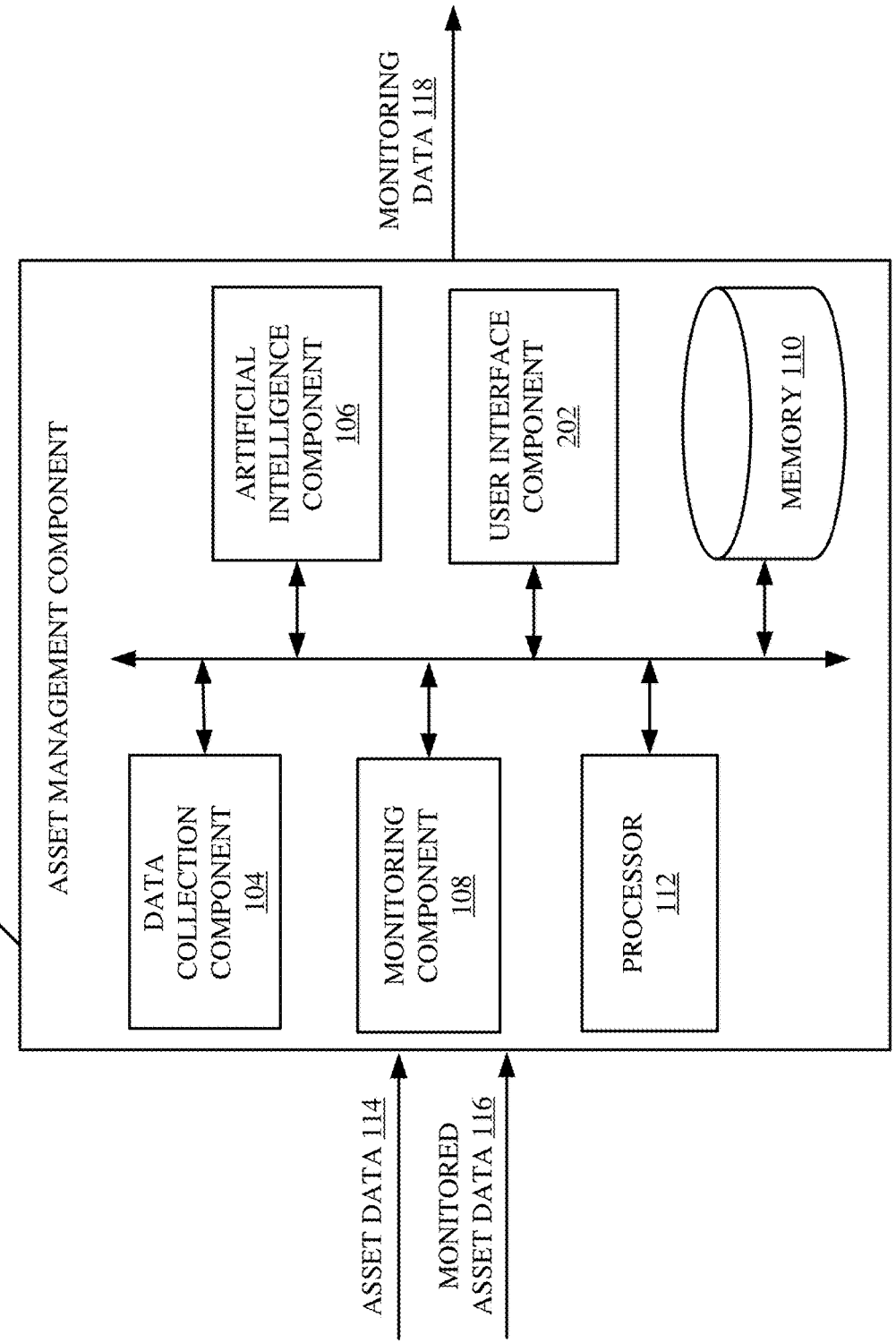
FIG. 2 illustrates a block diagram of another example, non-limiting system that includes an asset management component in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 includes the asset management component 102. In FIG. 2, the asset management component 102 can include the data collection component 104, the artificial intelligence component 106, the monitoring component 108, the memory 110, the processor 112, and/or a user interface component 202. The user interface component 202 can generate a graphical user interface for a computing device. The computing device can be, for example, a device with a display such as, but not limited to, a user device, a computer, a desktop computer, a laptop computer, a monitor device, a smart device, a smart phone, a mobile device, a handheld device, a tablet, a portable computing device or another type of computing device associated with a display. In certain embodiments, the computing device can be associated with a web browser. For example, the graphical user interface can be presented via a web browser executed on the computing device. In an aspect, the user interface component 202 can generate a graphical user interface, for display, that outputs information associated with the asset data 114, the monitored asset data 116 and/or the monitoring data 118 in a human interpretable format. The user interface component 202 can render a display to present and/or receive data from the computing device. In an embodiment, the user interface component 202 can generate a notification for the computing device via the graphical user interface in response to a determination, based on the set of digital signatures that includes the set of patterns regarding the asset data 114, that monitored asset data for the asset satisfies a defined criterion. For example, the user interface component 202 can generate a notification for the computing device in response to a determination, based on the set of digital signatures that includes the set of patterns regarding the set of voltage measurements, that voltage data for the asset satisfies a defined criterion. In another embodiment, the user interface component 202 can provide the graphical user interface via the computing device to provide information regarding the monitoring data 118. For example, the user interface component 202 can provide the graphical user interface via the computing device to provide information regarding the performance of the asset associated with the monitored asset data 116 based on the set of digital signatures.

In certain embodiments, information associated with the asset data 114, the monitored asset data 116 and/or the monitoring data 118 can be presented graphically via the graphical user interface in an easily comprehensible manner. The information associated with the asset data 114, the monitored asset data 116 and/or the monitoring data 118 can be presented, for example, as one or more of alphanumeric characters, graphics, animations, audio and video. Furthermore, the information associated with the asset data 114, the monitored asset data 116 and/or the monitoring data 118 can be static or updated dynamically to provide information in real-time as changes or events occur. The user interface component 202 can display and/or facilitate display one or more display elements associated with the asset data 114, the monitored asset data 116 and/or the monitoring data 118. The user interface component 202 can generate, receive, retrieve or otherwise obtain a graphical element (e.g., a graphical representation) associated with the asset data 114, the monitored asset data 116 and/or the monitoring data 118. In accordance with one aspect, a graphical element (e.g., a graphical representation) provided by the user interface component 202 can form all or part of a complete display rendered on the computing device. In addition to the graphical representation, one or more items can form part of the display. In one example, the user interface component 202 can generate a notification associated with the monitoring data 118, a message associated with the monitoring data 118, an icon associated with the monitoring data 118, a thumbnail associated with the monitoring data 118, a dialog box associated with the monitoring data 118, a tool associated with the monitoring data 118, a widget associated with the monitoring data 118, a graph associated with the monitoring data 118, and/or another display element associated with the monitoring data 118. A display element associated with the monitoring data 118 can be transparent, translucent or opaque. A display element associated with the monitoring data 118 can also be various sizes, various colors, various brightness, and so forth as well as being animated (e.g., for fading in and out, etc.). In an embodiment, the user interface component 202 can present information associated with the monitoring data 118 via a graph. For example, the user interface component 202 can present one or more parameters and/or a set of values over time in a graph. The user interface component 202 can also modify the graph based on user feedback data. For example, a user can progress back and forth through a time axis of the graph. A user can also select a portion of the graph (e.g., a horizontal portion of the graph) via a cursor.

While FIG. 2 depicts separate components in the asset management component 102, it is to be appreciated that two or more components may be implemented in a common component. Further, it can be appreciated that the design of system 200 and/or the asset management component 102 can include other component selections, component placements, etc., to facilitate asset performance management.

Figure 3:
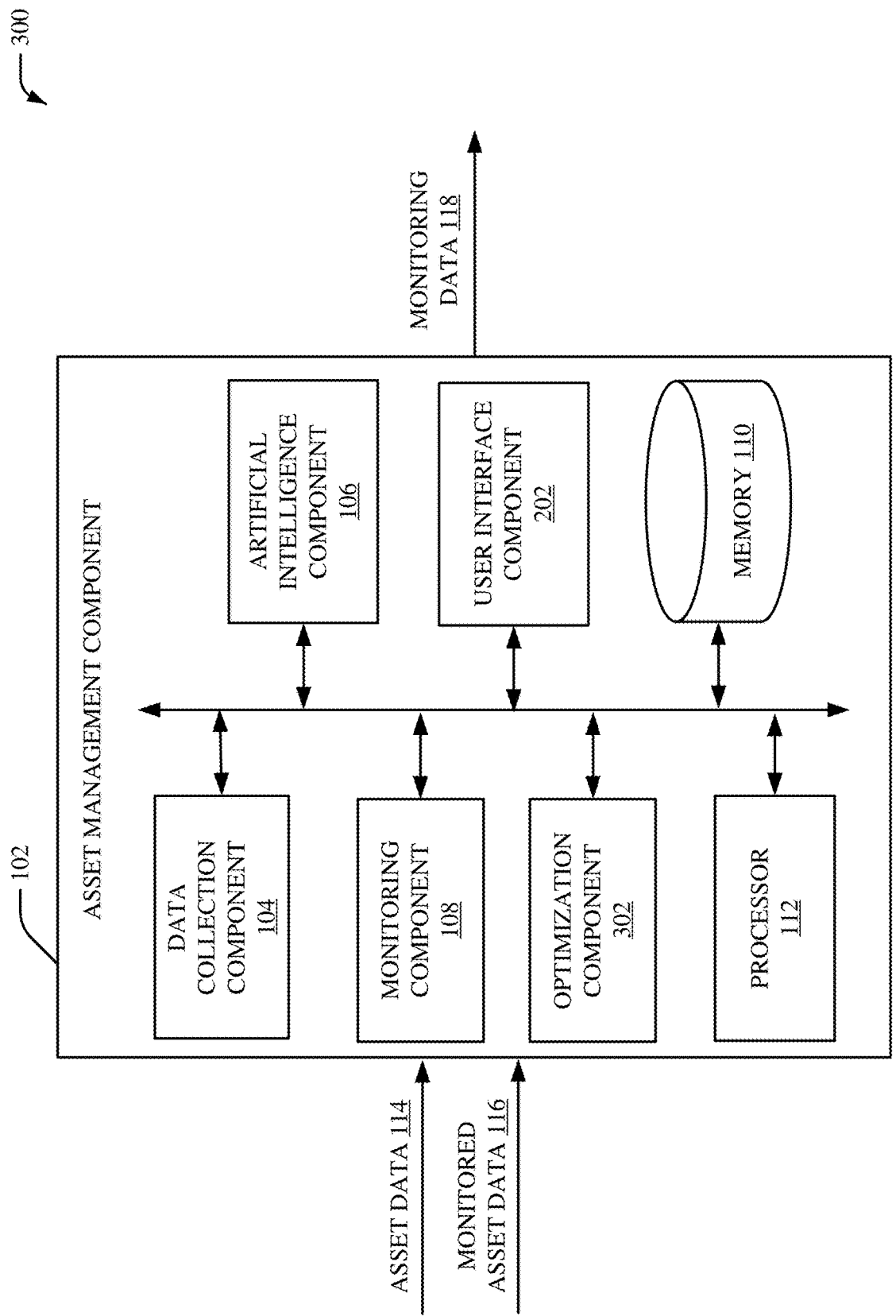
FIG. 3 illustrates a block diagram of yet another example, non-limiting system that includes an asset management component in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 200 includes the asset management component 102. In FIG. 2, the asset management component 102 can include the data collection component 104, the artificial intelligence component 106, the monitoring component 108, the memory 110, the processor 112, the user interface component 202, and/or an optimization component 302.

The optimization component 302 can be employed to optimize the asset associated with the monitored asset data 116.

In an embodiment, the optimization component 302 can prognose a future event identified by the monitoring data 118 based at least in part on the generated inferences and the match between the digital signature associated with the monitored asset data 116 and the set of digital signatures associated with the asset data 114. For example, the optimization component 302 can associate the digital signature associated with the monitored asset data 116 with an event in response to a determination that the digital signature associated with the monitored asset data 116 matches a data signature from the set of digital signatures associated with the asset data 114. In an aspect, the optimization component 302 can trigger one or more actions in response to a determination that the digital signature associated with the monitored asset data 116 matches a data signature from the set of digital signatures associated with the asset data 114. An action can be, for example, execution of a certain task or a certain function. An action can be, in certain embodiments, external to the system 100, the system 200 and/or the system 300. For example, an action can be performed with respect to an asset associated with the monitored asset data 116 and/or a system that includes an asset associated with the monitored asset data 116. In another example, an action can be associated with an analytics process related to the asset associated with the monitored asset data 116. For example, the learned digital signatures can be employed as conditional statements in analytics that trigger an analytic engine to execute one or more processes associated with the asset associated with the monitored asset data 116. In certain embodiments embodiment, the optimization component 302 can modify a parameter (e.g., an asset parameter, a machine parameter, etc.) for the asset associated with the monitored asset data 116 in response to a determination that the monitoring data 118 satisfies a defined criterion. For instance, the optimization component 302 can modify a parameter (e.g., an asset parameter, a machine parameter, etc.) for the asset associated with the monitored asset data 116 in response to a determination that a digital signature associated with the monitored asset data 116 satisfies a defined criterion. In one example, the optimization component 302 can modify a parameter (e.g., an asset parameter, a machine parameter, etc.) for the asset associated with the monitored asset data 116 in response to a determination that the digital signature associated with the monitored asset data 116 matches a data signature from the set of digital signatures associated with the asset data 114. Additionally or alternatively, the optimization component 302 can update the set of digital signatures associated with the asset data 114 based on the monitoring data. For instance, the optimization component 302 can update the set of digital signatures associated with the asset data 114 based on monitored performance of the asset associated with the monitored asset data 116. In one example, the optimization component 302 can update the set of digital signatures associated with the asset data 114 in response to a determination that the digital signature associated with the monitored asset data 116 matches a data signature from the set of digital signatures associated with the asset data 114.

While FIG. 3 depicts separate components in the asset management component 102, it is to be appreciated that two or more components may be implemented in a common component. Further, it can be appreciated that the design of system 300 and/or the asset management component 102 can include other component selections, component placements, etc., to facilitate asset performance management.

Figure 4:
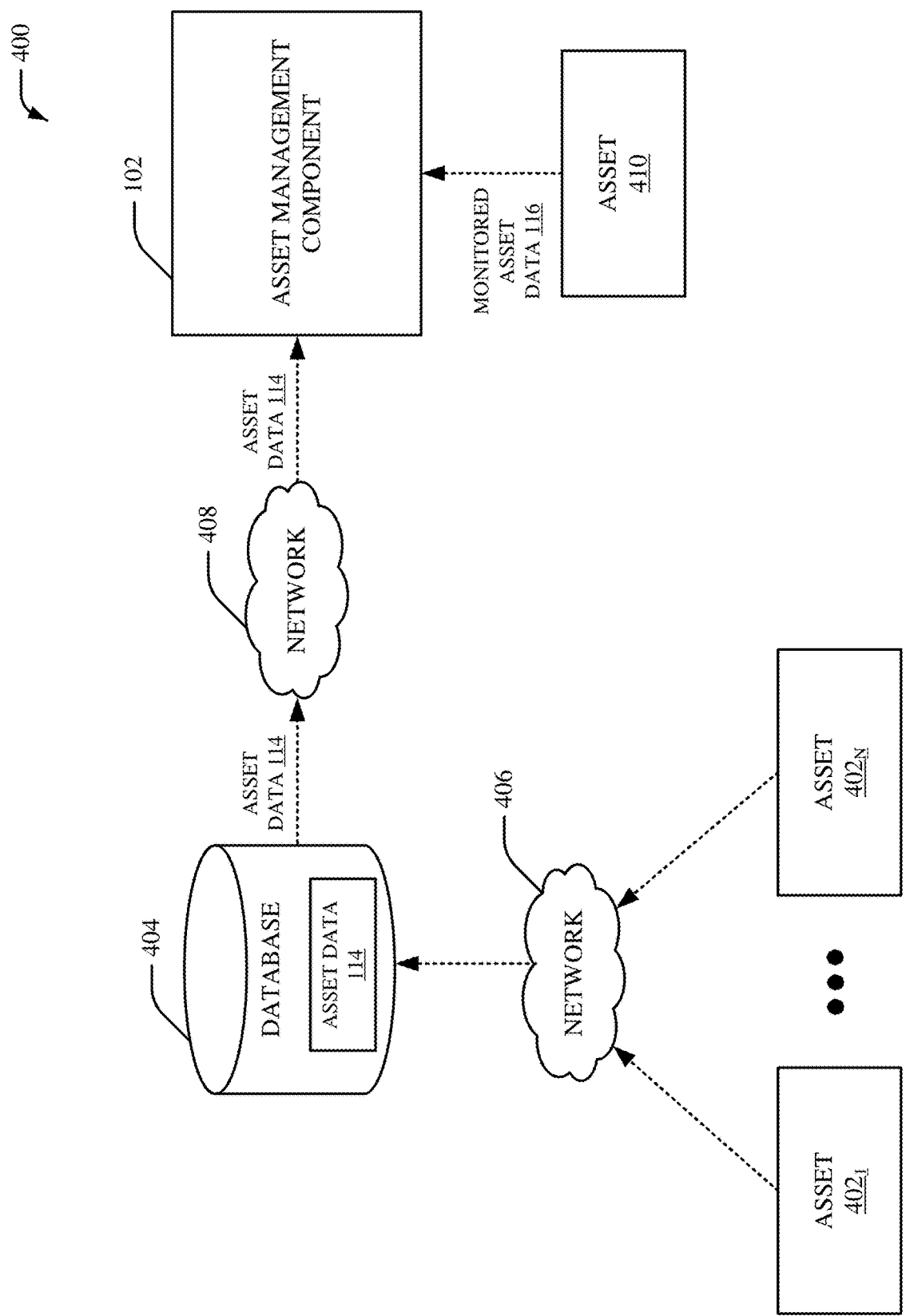
FIG. 4 illustrates an example, non-limiting system for active asset monitoring in accordance with one or more embodiments described herein.

Referring now to FIG. 4, there is illustrated a non-limiting implementation of a system 400 in accordance with one or more embodiments described herein. Repetitive description of like elements employed in other embodiments described herein is omitted for sake of brevity.

The system 400 includes one or more assets 402$_{1-N}$ and a database 404. The one or more assets 402$_{1-N}$ and the database 404 can be in communication via a network 406. The network 406 can be a communication network, a wireless network, a wired network, an internet protocol (IP) network, a voice over IP network, an internet telephony network, a mobile telecommunications network and/or another type of network. An asset from the one or more assets 402$_{1-N}$ can be a device, a machine, a vehicle, equipment, an aircraft, an engine, a sensor device, a controller device (e.g., a programmable logic controller), a Supervisory Control And Data Acquisition (SCADA) device, a meter device, a monitoring device (e.g., a remote monitoring device), a network-connected device, a remote terminal unit, a telemetry device, a user interface device (e.g., a human-machine interface device), a historian device, a computing device, and/or another type of asset. In a non-limiting example, at least one asset from the one or more assets 402$_{1-N}$ can be an electric discharge machine. The one or more assets 402$_{1-N}$ can also provide the asset data 114 to the database 404 via the network 406. Furthermore, the database 404 can store the asset data 114. In an aspect, the database 404 and the asset management component 102 can be in communication via a network 408. The network 408 can be a communication network, a wireless network, a wired network, an IP network, a voice over IP network, an internet telephony network, a mobile telecommunications network and/or another type of network. In an embodiment, the asset management component 102 can receive the asset data 114 from the database 404. For example, the asset management component 102 can receive the asset data 114 via the network 408. In an embodiment, the asset management component 102 can be in communication with an asset 410. In one example, the asset management component 102 can be in communication with an asset 410 via a network such as a communication network, a wireless network, a wired network, an IP network, a voice over IP network, an internet telephony network, a mobile telecommunications network and/or another type of network. In another example, the asset management component 102 can be in direct communication with an asset 410. The asset 410 can be a device, a machine, a vehicle, equipment, an aircraft, an engine, a sensor device, a controller device (e.g., a programmable logic controller), a SCADA device, a meter device, a monitoring device (e.g., a remote monitoring device), a network-connected device, a remote terminal unit, a telemetry device, a user interface device (e.g., a human-machine interface device), a historian device, a computing device, and/or another type of asset. In a non-limiting example, the asset 410 can be an electric discharge machine. The asset 410 can be a monitored asset that is monitored by the asset management component 102. In an aspect, the asset 410 can provide the monitored asset data 116 to the asset management component 102.

Compared to a conventional system, the asset management component 102 can provide improved accuracy, reduced time, greater capabilities and/or greater adaptability for managing performance and/or maintenance for an asset. Additionally, by employing the asset management component 102, performance of the asset 410 can be improved, costs associated with the asset 410 can be reduced, and risks associated with the asset 410 can be minimized. Moreover, it is to be appreciated that technical features of the asset management component 102 and management of performance and/or maintenance of the asset 410, etc. are highly technical in nature and not abstract ideas. Processing threads of the asset management component 102 that process the asset data 114 and/or the monitored asset data 116 cannot be performed by a human (e.g., are greater than the capability of a single human mind). For example, the amount of the asset data 114 and/or the monitored asset data 116 processed, the speed of processing of the asset data 114 and/or the monitored asset data 116 by the asset management component 102 (and/or the data types of the asset data 114 and/or the monitored asset data 116 analyzed by the asset management component 102) over a certain period of time can be respectively greater, faster and different than the amount, speed and data type that can be processed by a single human mind over the same period of time. Furthermore, the asset data 114 and/or the monitored asset data 116 analyzed by the asset management component 102 can be raw data and/or compressed data associated with the one or more assets 402$_{1-N}$ and/or the asset 410. Moreover, the asset management component 102 can be fully operational towards performing one or more other functions (e.g., fully powered on, fully executed, etc.) while also analyzing the asset data 114 and/or the monitored asset data 116.

Figure 5:
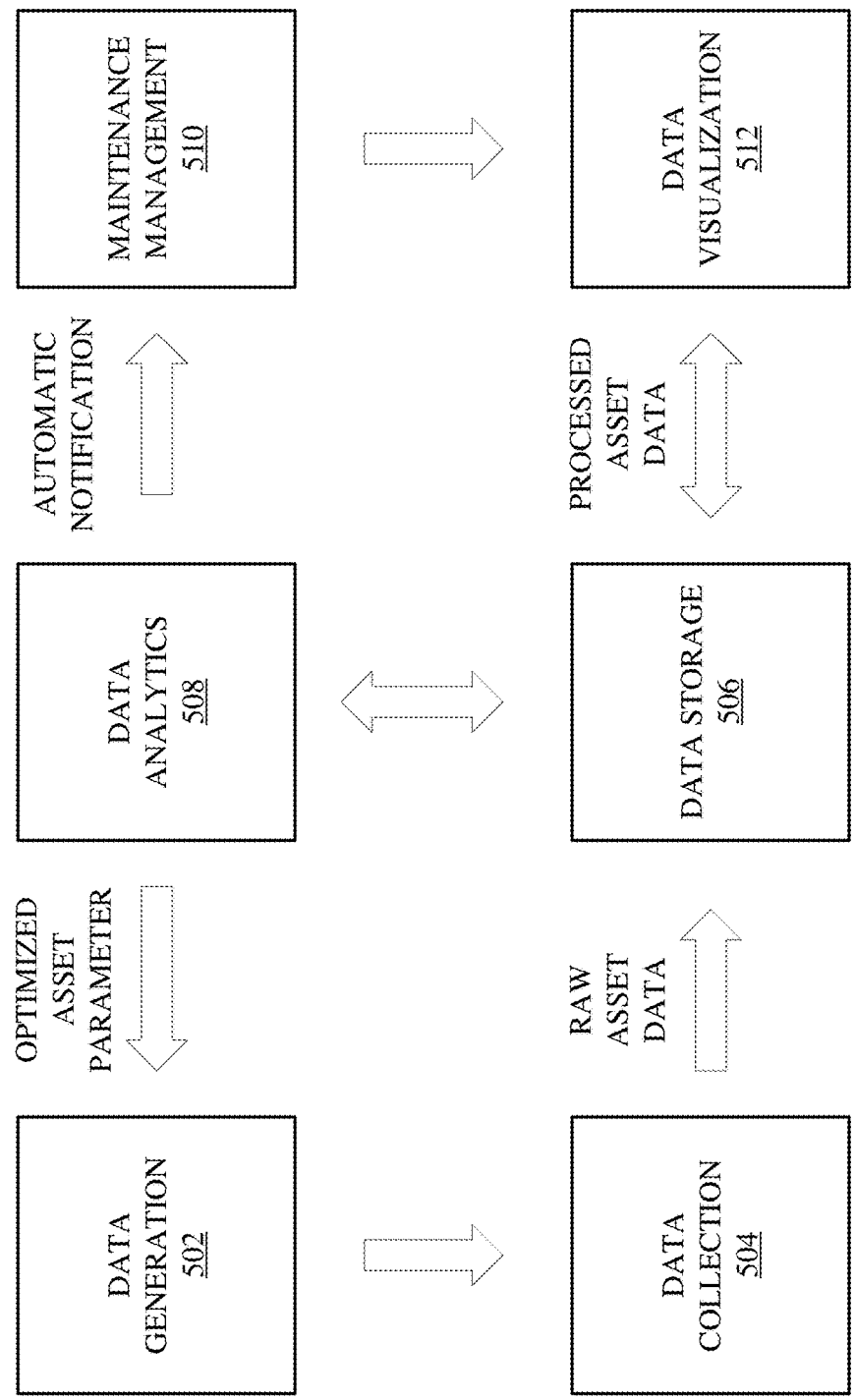
FIG. 5 illustrates another example, non-limiting system for active asset monitoring in accordance with one or more embodiments described herein.

Referring now to FIG. 5, there is illustrated a non-limiting implementation of a system 500 in accordance with one or more embodiments described herein. Repetitive description of like elements employed in other embodiments described herein is omitted for sake of brevity.

The system 500 includes data generation 502, data collection 504, data storage 506, data analytics 508, maintenance management 510 and/or data visualization 512. The data generation 502 can be a data generation process performed, for example, by the one or more assets $402_{1-N}$ and/or the asset 410. In one example, the data generation 502 can generate the asset data 114 and/or the monitored asset data 116 via the one or more assets $402_{1-N}$ and/or the asset 410. The data collection 504 can be a data collection process performed, for example, by the data collection component 104. For example, the data collection 504 can collect the asset data 114 via the data collection component 104. Alternatively, the data collection 504 can be a data monitoring process performed, for example, by the monitoring component 108. For example, the data collection 504 can collect the monitored asset data 116 via the monitoring component 108. In certain embodiments, the asset data 114 and/or the monitored asset data 116 can be raw asset data provided to the data storage 506. The data storage 506 can be a data storage process where the asset data and/or the monitored asset data is stored in a database. The data storage 506 can be performed, for example, by the data collection component 104 and/or the monitoring component 108. The data analytics 508 can be a data analytics process performed, for example, by the artificial intelligence component 106 and/or the monitoring component 108. For instance, the data analytics 508 can perform data analytics with respect to the asset data 114. Additionally or alternatively, the data analytics 508 can perform data analytics with respect to the monitored asset data 116. In one example, the data analytics 508 can perform one or more artificial intelligence techniques with respect to the asset data 114 and/or the monitored asset data 116. The maintenance management 510 can be a maintenance management process performed, for example, by the user interface component 202 and/or the optimization component 302. In certain embodiments, an automatic notification can be provided to the maintenance management 510 in response to a determination that the data analytics 508 satisfies a defined criterion. Additionally or alternatively, in certain embodiments, an optimized asset parameter can be provided to the data generation 502 in response to a determination that the data analytics 508 satisfies a defined criterion. The data visualization 512 can be a data visualization process performed, for example, by the user interface component 202. For instance, a visualization of the data analytics 508 can be provided via the data visualization 512.

Figure 6:
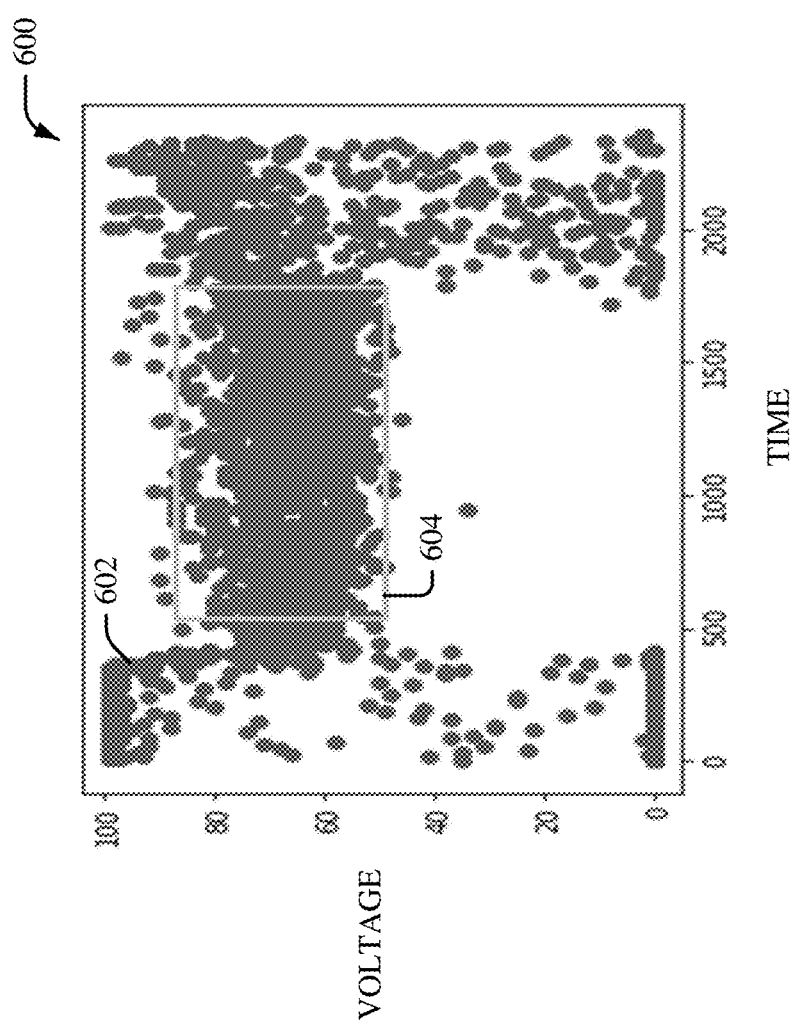
FIG. 6 illustrates an example, non-limiting digital signature in accordance with one or more embodiments described herein.

Referring now to FIG. 6, there is illustrated a non-limiting implementation of a data signature 600 in accordance with one or more embodiments described herein. Repetitive description of like elements employed in other embodiments described herein is omitted for sake of brevity.

The data signature 600 can be a data signature for asset data associated with an asset. In an aspect, the data signature 600 can be an example data signature generated by the artificial intelligence component 106. The data signature 600 can include, for example, a graph of asset data. For example, in the embodiment shown in FIG. 6, the data signature 600 can include voltage data 602 plotted based on voltage vs time. For instance, the voltage data 602 can be a set of voltage measurements for an asset. In an example, the voltage data 602 can correspond to at least a portion of the asset data 114 and/or the monitored asset data 116 received by the asset management component 102. The data signature 600 can also include a portion 604 of the voltage data 602 that represents voltage degradation as an indicator for an event associated with an asset. For example, the portion 604 of the voltage data 602 can illustrate voltage variance that can be employed to identify and/or predict an event for an asset associated with the voltage data 602.

Figure 7:
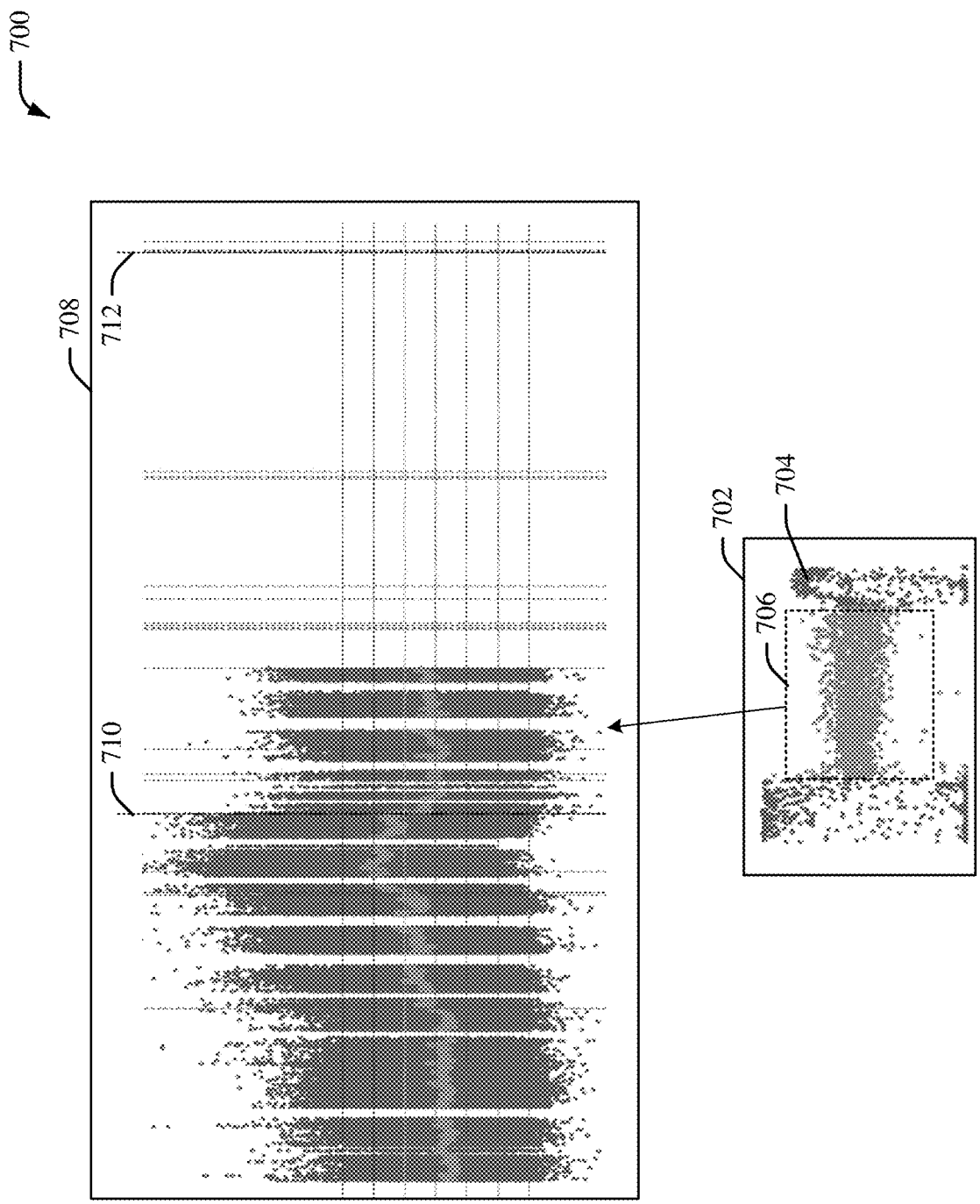
FIG. 7 illustrates an example, non-limiting system associated with a digital signature and a voltage variance plot in accordance with one or more embodiments described herein.

Referring now to FIG. 7, there is illustrated a non-limiting implementation of a system 700 in accordance with one or more embodiments described herein. Repetitive description of like elements employed in other embodiments described herein is omitted for sake of brevity.

The system 700 includes a data signature 702. The data signature 702 can be a data signature for asset data associated with an asset. In an aspect, the data signature 702 can be an example data signature generated by the artificial intelligence component 106. The data signature 702 can include, for example, a graph of asset data. For example, the data signature 702 can include voltage data 704 plotted based on voltage vs time. For instance, the voltage data 704 can be a set of voltage measurements for an asset. In an example, the voltage data 704 can correspond to at least a portion of the asset data 114 and/or the monitored asset data 116 received by the asset management component 102. The data signature 702 can also include a portion 706 of the voltage data 704 that represents voltage degradation as an indicator for an event associated with an asset. For example, the portion 706 of the voltage data 704 can illustrate voltage variance that can be employed to identify and/or predict an event for an asset associated with the voltage data 704. The system 700 can also include a voltage variance plot 708. The voltage variance plot 708 can be, for example, a voltage variance plot generated by the monitoring component 108 to facilitate monitoring of an asset. In an embodiment, a standard deviation of the portion 706 of the voltage data 704 can be represented as a data point on the voltage variance plot 708. In an aspect, the voltage variance plot 708 can be employed by the monitoring component 108 to detect and/or predict one or more events for an asset. For example, data associated with voltage variance at time point 710 can correspond to a failure event for an asset. Furthermore, data associated with voltage variance at time point 712 can correspond to a future failure event (e.g., a predicted failure event) for an asset.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 8:
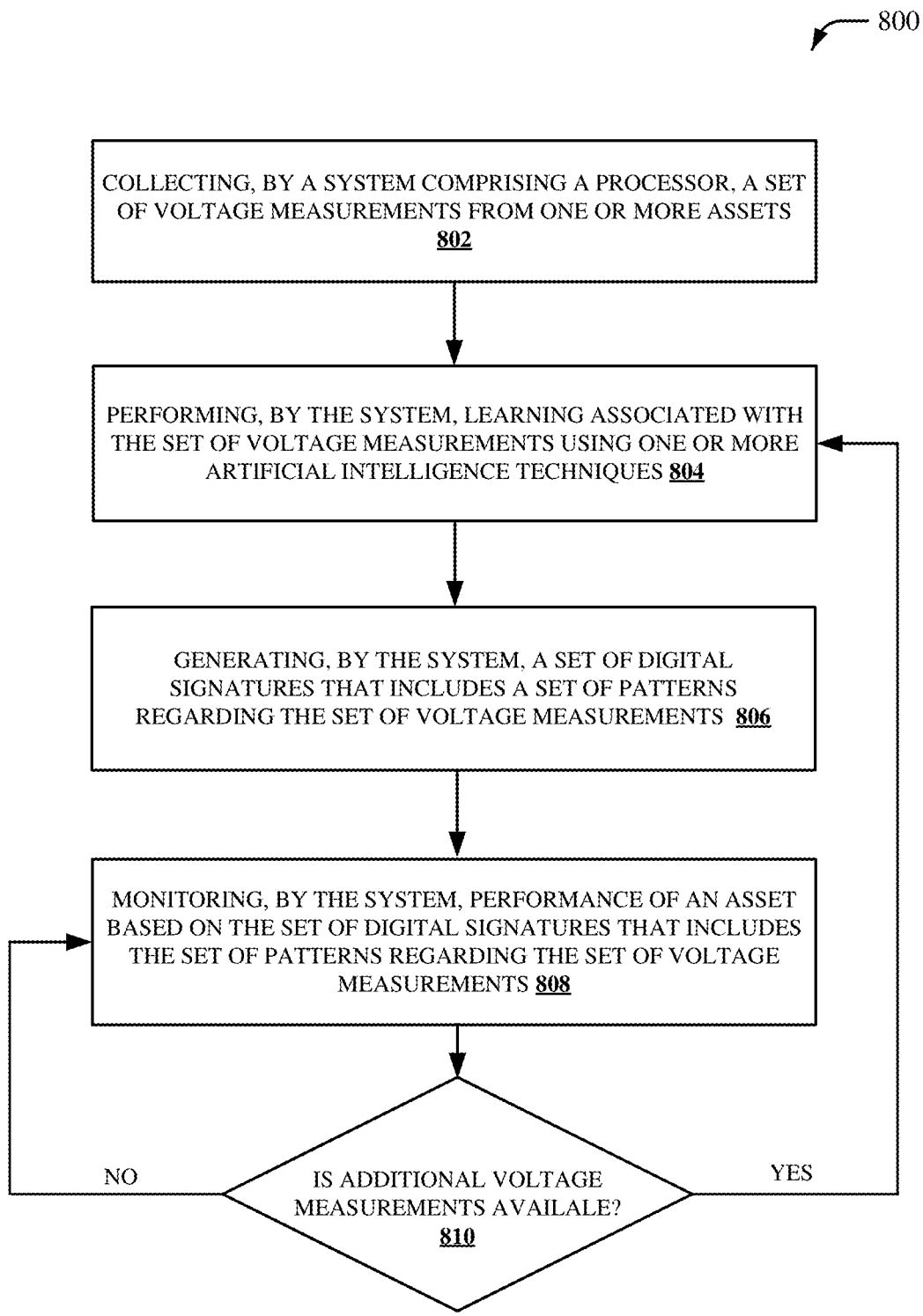
FIG. 8 illustrates a flow diagram of an example, non-limiting method for active asset monitoring in accordance with one or more embodiments described herein.

FIG. 8 illustrates a methodology and/or a flow diagram in accordance with the disclosed subject matter. For simplicity of explanation, the methodology is depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodology in accordance with the disclosed subject matter. In addition, those skilled in the art will understand and appreciate that the methodology could alternatively be represented as a series of interrelated states via a state diagram or events. Additionally, it should be further appreciated that the methodology disclosed hereinafter and throughout this specification are capable of being stored on an article of manufacture to facilitate transporting and transferring such methodologies to computers. The term article of manufacture, as used herein, is intended to encompass a computer program accessible from any computer-readable device or storage media.

Referring to FIG. 8, there illustrated is a methodology 800 for active asset monitoring, according to one or more embodiments of the subject innovation. As an example, the methodology 800 can be utilized in various applications, such as, but not limited to, asset systems, equipment systems, aviation systems, engine systems, aircraft systems, automobile systems, water craft systems, industrial equipment systems, industrial systems, manufacturing systems, factory systems, energy management systems, power grid systems, water supply systems, transportation systems, healthcare systems, refinery systems, media systems, financial systems, data-driven prognostics systems, diagnostics systems, digital systems, asset management systems, machine learning systems, neural network systems, network systems, computer network systems, communication systems, enterprise systems, etc. At 802, a set of voltage measurements from one or more assets is collected by a system comprising a processor (e.g., by data collection component 104). For instance, voltage data (e.g., the set of voltage measurements) can be gathered from one or more portions of each asset (e.g., each hole of each asset from a set of assets). An asset from the one or more assets can be a device, a machine, a vehicle, equipment, an aircraft, an engine, a sensor device, a controller device (e.g., a programmable logic controller), a SCADA device, a meter device, a monitoring device (e.g., a remote monitoring device), a network-connected device, a remote terminal unit, a telemetry device, a user interface device (e.g., a human-machine interface device), a historian device, a computing device, and/or another type of asset. In a non-limiting example, at least one asset from the one or more assets can be an electric discharge machine. Additionally or alternatively, other data such as sensor data, machine data, process data (e.g., process log data), operational data, monitoring data, maintenance data, parameter data, measurement data, performance data, industrial data, machine data, asset data, equipment data, device data, meter data, real-time data, historical data, audio data, image data, video data, and/or other data can be collected from the one or more assets.

At 804, learning associated with the set of voltage measurements is performed, by the system (e.g., by artificial intelligence component 106), using one or more artificial intelligence techniques. The one or more artificial intelligence techniques can employ principles of artificial intelligence to facilitate learning and/or generating inferences associated with the set of voltage measurements. For example, the learning can facilitate identification and/or classification of different patterns associated with the set of voltage measurements.

At 806, a set of digital signatures that includes a set of patterns regarding the set of voltage measurements is generated by the system (e.g., by artificial intelligence component 106). For instance, a set of digital signatures that includes a set of patterns regarding the set of voltage measurements can be generated. In one example, to facilitate detection of one or more future events for an asset, the set of digital signatures can be learned. Furthermore, inferences regarding the set of digital signatures can be determined. A data signature from the set of digital signatures can represent a subset of the set of voltage measurements. Furthermore, a digital signature from the set of digital signatures can be a digital fingerprint data that represents a digital pattern. For example, a digital signature from the set of digital signatures can be a digital fingerprint that comprises digital fingerprint data (e.g., a string of bits) associated with a portion of the set of voltage measurements. A digital signature from the set of digital signatures can also include a set of data values (e.g., a set of measurements) over a defined period of time. In an aspect, a data signature from the set of digital signatures can represent a digital fingerprint for an event. For example, a data signature from the set of digital signatures can represent a digital fingerprint for a failure event associated with a failure condition. Moreover, a digital signature from the set of digital signatures can represent a digital pattern for a portion of the set of voltage measurements. For instance, a digital signature from the set of digital signatures can be generated based on physical characteristics of the set of voltage measurements such as peaks in the set of voltage measurements, troughs in the set of voltage measurements, speed of change associated with the set of voltage measurements, a length of time between a first peak in the set of voltage measurements and a second peak in the set of voltage measurements, and/or other graphical characteristics of the set of voltage measurements. As such, a digital signature from the set of digital signatures can convey trends (e.g., graphical trends) and/or predict anomalies in the set of voltage measurements.

At 808, performance of an asset is monitored, by the system (e.g., by monitoring component 108), based on the set of digital signatures that includes the set of patterns regarding the set of voltage measurements. In an aspect, monitored asset data generated by the asset can be received. For instance, the asset can be monitored to collect the monitored asset data. The monitored asset data can include a set of monitored voltage measurements. The monitored asset data can be generated by an asset that generates at least a portion of the set of voltage measurements. Alternatively, the monitored asset data can be generated by an asset that is different than one or more assets that generate the set of voltage measurements. The asset associated with the monitored asset data can be one or more assets, one or more devices, one or more machines and/or one or more types of equipment. The asset can be a device, a machine, a vehicle, equipment, an aircraft, an engine, a sensor device, a controller device (e.g., a programmable logic controller), a SCADA device, a meter device, a monitoring device (e.g., a remote monitoring device), a network-connected device, a remote terminal unit, a telemetry device, a user interface device (e.g., a human-machine interface device), a historian device, a computing device, and/or another type of asset. In a non-limiting example, the asset can be an electric discharge machine. Additionally or alternatively, other monitored data such as sensor data, machine data, process data (e.g., process log data), operational data, monitoring data, maintenance data, parameter data, measurement data, performance data, industrial data, machine data, asset data, equipment data, device data, meter data, real-time data, historical data, audio data, image data, video data, and/or other data can be obtained from the asset to facilitate the monitoring.

In an embodiment, performance of the asset can be monitored based on a digital signature associated with the monitored asset data. The digital signature associated with the monitored asset data can be a digital fingerprint data that represents a digital pattern. For example, digital signature associated with the monitored asset data can be a digital fingerprint that comprises digital fingerprint data (e.g., a string of bits) associated with a portion of the monitored asset data. The digital signature associated with the monitored asset data can also include a set of data values (e.g., a set of measurements) over a defined period of time. In an aspect, the digital signature associated with the monitored asset data can represent a digital pattern for a portion of the set of monitored voltage measurements. For instance, the digital signature associated with the monitored asset data can be generated based on physical characteristics of the monitored asset data such as peaks in the monitored asset data, troughs in the monitored asset data, speed of change associated with the monitored asset data, a length of time between a first peak in the monitored asset data and a second peak in the monitored asset data, and/or other graphical characteristics of the monitored asset data. As such, the digital signature associated with the monitored asset data can convey trends (e.g., graphical trends) and/or predict anomalies in the monitored asset data. In another aspect, the digital signature associated with the monitored asset data can be compared to the set of digital signatures associated with the set of voltage measurements to facilitate monitoring the performance of the asset. For instance, the digital signature associated with the monitored asset data can be compared to the set of digital signatures associated with the set of voltage measurements in order to identify one or more matches between digital signatures and/or one or more future events associated with the asset. In certain embodiments, a future event associated with a particular condition for the asset can be identified based on a comparison between the digital signature associated with the monitored asset data and the set of digital signatures that includes the set of patterns regarding the set of voltage measurements. In certain embodiments, a future failure event associated with a failure condition for the asset can be identified based on a comparison between the digital signature associated with the monitored asset data and the set of digital signatures that includes the set of patterns regarding the set of voltage measurements. In certain embodiments, a notification for a computing device can be generated in response to a determination, based on a comparison between the digital signature associated with the monitored asset data and the set of digital signatures that includes the set of patterns regarding the set of voltage measurements, that voltage data for the asset satisfies a defined criterion. In certain embodiments, a graphical user interface can be rendered via a computing device that provides information regarding the performance of the asset based on the set of digital signatures. In certain embodiments, a parameter for the asset can be modified in response to a determination that a digital signature associated with the asset satisfies a defined criterion. For example, a parameter for the asset can be modified in response to a determination that the digital signature associated with the monitored asset data matches a digital signature from the set of digital signatures that includes the set of patterns regarding the set of voltage measurements. In certain embodiments, the set of digital signatures can be modified based on monitored performance of the asset.

At 810, it is determined whether additional voltage measurements are available. If yes, methodology 800 returns to 804 to perform learning with respect to the additional voltage measurements. If no, methodology 800 returns to 808 to continue with monitoring of the performance of the asset.

Figure 9:
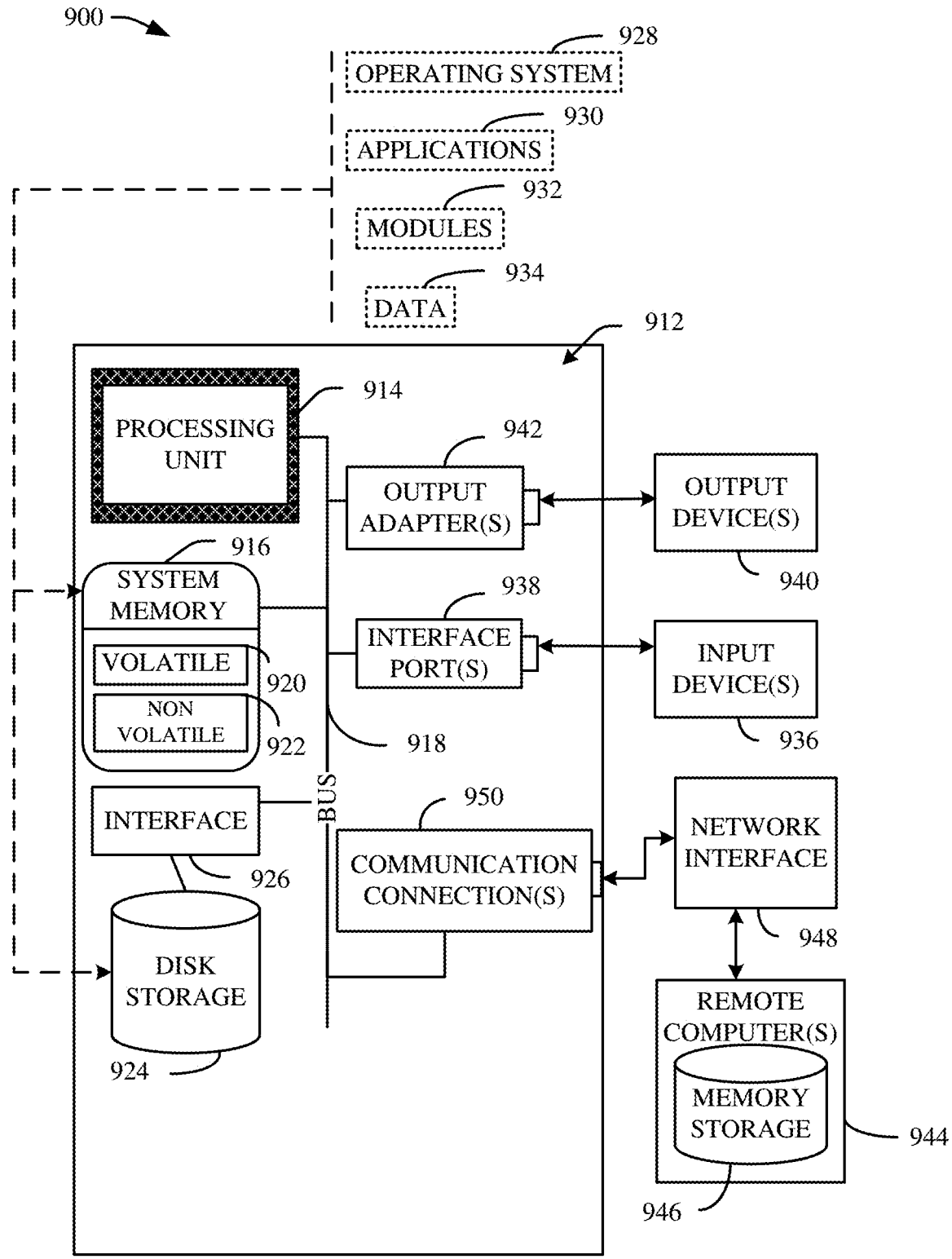
FIG. 9 is a schematic block diagram illustrating a suitable operating environment.
Figure 10:
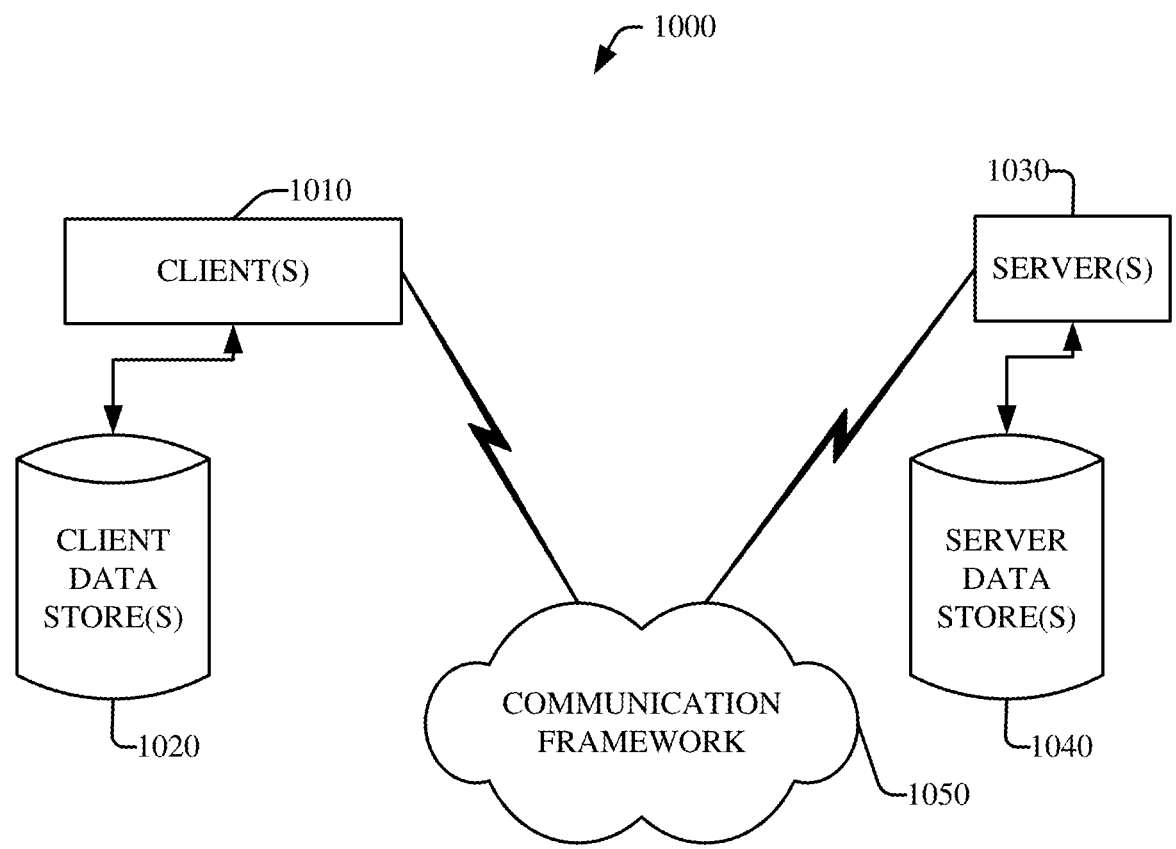
FIG. 10 is a schematic block diagram of a sample-computing environment.

In order to provide a context for the various aspects of the disclosed subject matter, FIGS. 9 and 10 as well as the following discussion are intended to provide a brief, general description of a suitable environment in which the various aspects of the disclosed subject matter may be implemented.

With reference to FIG. 9, a suitable environment 900 for implementing various aspects of this disclosure includes a computer 912. The computer 912 includes a processing unit 914, a system memory 916, and a system bus 918. The system bus 918 couples system components including, but not limited to, the system memory 916 to the processing unit 914. The processing unit 914 can be any of various available processors. Dual microprocessors and other multiprocessor architectures also can be employed as the processing unit 914.

The system bus 918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 916 includes volatile memory 920 and nonvolatile memory 922. The basic input/output system (BIOS), containing the basic routines to transfer information between elements within the computer 912, such as during start-up, is stored in nonvolatile memory 922. By way of illustration, and not limitation, nonvolatile memory 922 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 920 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 912 also includes removable/non-removable, volatile/nonvolatile computer storage media. FIG. 9 illustrates, for example, a disk storage 924. Disk storage 924 includes, but is not limited to, devices like a magnetic disk drive, floppy disk drive, tape drive, Jaz drive, Zip drive, LS-100 drive, flash memory card, or memory stick. The disk storage 924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 924 to the system bus 918, a removable or non-removable interface is typically used, such as interface 926.

FIG. 9 also depicts software that acts as an intermediary between users and the basic computer resources described in the suitable operating environment 900. Such software includes, for example, an operating system 928. Operating system 928, which can be stored on disk storage 924, acts to control and allocate resources of the computer system 912. System applications 930 take advantage of the management of resources by operating system 928 through program modules 932 and program data 934, e.g., stored either in system memory 916 or on disk storage 924. It is to be appreciated that this disclosure can be implemented with various operating systems or combinations of operating systems.

A user enters commands or information into the computer 912 through input device(s) 936. Input devices 936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 914 through the system bus 918 via interface port(s) 938. Interface port(s) 938 include, for example, a serial port, a parallel port, a game port, and a universal serial bus (USB). Output device(s) 940 use some of the same type of ports as input device(s) 936. Thus, for example, a USB port may be used to provide input to computer 912, and to output information from computer 912 to an output device 940. Output adapter 942 is provided to illustrate that there are some output devices 940 like monitors, speakers, and printers, among other output devices 940, which require special adapters. The output adapters 942 include, by way of illustration and not limitation, video and sound cards that provide a means of connection between the output device 940 and the system bus 918. It should be noted that other devices and/or systems of devices provide both input and output capabilities such as remote computer(s) 944.

Computer 912 can operate in a networked environment using logical connections to one or more remote computers, such as remote computer(s) 944. The remote computer(s) 944 can be a personal computer, a server, a router, a network PC, a workstation, a microprocessor based appliance, a peer device or other common network node and the like, and typically includes many or all of the elements described relative to computer 912. For purposes of brevity, only a memory storage device 946 is illustrated with remote computer(s) 944. Remote computer(s) 944 is logically connected to computer 912 through a network interface 948 and then physically connected via communication connection 950. Network interface 948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 950 refers to the hardware/ software employed to connect the network interface 948 to the bus 918. While communication connection 950 is shown for illustrative clarity inside computer 912, it can also be external to computer 912. The hardware/software necessary for connection to the network interface 948 includes, for exemplary purposes only, internal and external technologies such as, modems including regular telephone grade modems, cable modems and DSL modems, ISDN adapters, and Ethernet cards.

FIG. 10 is a schematic block diagram of a sample-computing environment 1000 with which the subject matter of this disclosure can interact. The system 1000 includes one or more client(s) 1010. The client(s) 1010 can be hardware and/or software (e.g., threads, processes, computing devices). The system 1000 also includes one or more server(s) 1030. Thus, system 1000 can correspond to a two-tier client server model or a multi-tier model (e.g., client, middle tier server, data server), amongst other models. The server(s) 1030 can also be hardware and/or software (e.g., threads, processes, computing devices). The servers 1030 can house threads to perform transformations by employing this disclosure, for example. One possible communication between a client 1010 and a server 1030 may be in the form of a data packet transmitted between two or more computer processes.

The system 1000 includes a communication framework 1050 that can be employed to facilitate communications between the client(s) 1010 and the server(s) 1030. The client(s) 1010 are operatively connected to one or more client data store(s) 1020 that can be employed to store information local to the client(s) 1010. Similarly, the server(s) 1030 are operatively connected to one or more server data store(s) 1040 that can be employed to store information local to the servers 1030.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Various aspects or features described herein can be implemented as a method, apparatus, system, or article of manufacture using standard programming or engineering techniques. In addition, various aspects or features disclosed in this disclosure can be realized through program modules that implement at least one or more of the methods disclosed herein, the program modules being stored in a memory and executed by at least a processor. Other combinations of hardware and software or hardware and firmware can enable or implement aspects described herein, including a disclosed method(s). The term "article of manufacture" as used herein can encompass a computer program accessible from any computer-readable device, carrier, or storage media. For example, computer readable storage media can include but are not limited to magnetic storage devices (e.g., hard disk, floppy disk, magnetic strips . . . ), optical discs (e.g., compact disc (CD), digital versatile disc (DVD), blu-ray disc (BD) . . . ), smart cards, and flash memory devices (e.g., card, stick, key drive . . . ), or the like.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or methods herein are intended to include, without being limited to including, these and any other suitable types of memory.

It is to be appreciated and understood that components, as described with regard to a particular system or method, can include the same or similar functionality as respective components (e.g., respectively named components or similarly named components) as described with regard to other systems or methods disclosed herein.

What has been described above includes examples of systems and methods that provide advantages of this disclosure. It is, of course, not possible to describe every conceivable combination of components or methods for purposes of describing this disclosure, but one of ordinary skill in the art may recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
   a processor; and
   a memory that stores executable instructions that, when executed by the processor, facilitate performance of operations, comprising:
   collecting a set of voltage measurements from an asset;
   generating a set of digital signatures from the set of voltage measurements the set of the digital signatures representing a subset of the set of voltage measurements wherein each voltage signature comprises a plot of voltage versus time;
   wherein the set of digital signatures is used to create a voltage variance plot to facilitate monitoring of the asset for a failure event, wherein at least some of the set of digital signatures include portions indicating voltage degradation and standard deviations of only the portions indicating voltage degradation are derived and the standard deviations are each mapped as single data points onto the voltage variance plot, the voltage variance plot having a y-axis showing standard deviation and an x-axis indicating time;
   wherein the voltage variance plot is displayed on a user interface and used to determine an occurrence of the failure event and is also selectively used to predict an occurrence of a future failure event.

2. The system of claim 1,
   further comprising generating a notification for a computing device in response to a determination of the failure event.

3. The system of claim 1,
   further comprising modifying a parameter for the asset in response to a determination of the failure event.

4. The system of claim 3,
   further comprising updating the set of digital signatures based on monitored performance of the asset.

5. A method, comprising:
   collecting, by a system comprising a processor, a set of voltage measurements from an asset;
   generating by the system a set of digital signatures from the set of voltage measurements, the set of the digital signatures representing a subset of the set of voltage measurements wherein each voltage signature comprises a plot of voltage versus time;
   wherein the set of digital signatures is used to create a voltage variance plot to facilitate monitoring of the asset for a failure event, wherein at least some of the set of digital signatures include portions indicating voltage degradation and standard deviations of only the portions indicating voltage degradation are derived and the standard deviations are each mapped as single data points onto the voltage variance plot, the voltage variance plot having a y-axis showing standard deviation and an x-axis indicating time;
   wherein the voltage variance plot is displayed on a user interface and used to determine an occurrence of the failure event and is also selectively used to predict an occurrence of a future failure event.

6. The method of claim 5, further comprising:
   generating, by the system, a notification for a computing device in response to a determination of a failure event.

7. The method of claim 5, further comprising:
   modifying, by the system, a parameter for the asset in response to a determination of the failure event.

8. The method of claim 5, further comprising:
   updating, by the system, the set of digital signatures based on monitored performance of the asset.

9. A computer readable storage device comprising instructions that, in response to execution, cause a system comprising a processor to perform operations, comprising:
   collecting a set of voltage measurements from an asset;
   generating a set of digital signatures from the set of voltage measurements, the set of voltage measurements comprising physical voltage characteristics, each digital signature of the set of digital signatures being a digital representation and generated based upon the physical voltage characteristics, the set of the digital signatures representing a subset of the set of voltage measurements wherein each voltage signature comprises a plot of voltage versus time;
   wherein the set of digital signatures is used to create a voltage variance plot to facilitate monitoring of the asset for a failure event, wherein at least some of the set of digital signatures include portions indicating voltage degradation and standard deviations of only the portions indicating voltage degradation are derived and the standard deviations are each mapped as single data points onto the voltage variance plot, the voltage variance plot having a y-axis showing standard deviation and an x-axis indicating time;
   wherein the voltage variance plot is displayed on a user interface and used to determine an occurrence of the failure event and is also selectively used to predict an occurrence of a future failure event.

10. The computer readable storage device of claim 9,
    further comprising generating a notification for a computing device in response to a determination of the failure event.

11. The computer readable storage device of claim 9,
    further comprising modifying a parameter for the asset in response to a determination of the failure event.

12. The computer readable storage device of claim 9,
    further comprising updating the set of digital signatures based on monitored performance of the asset.

13. The system of claim 1, wherein the asset is associated with aviation systems, engine systems, aircraft systems, automobile systems, water craft systems, industrial equipment systems, industrial systems, manufacturing systems, factory systems, energy management systems, power grid systems, water supply systems, transportation systems, healthcare systems, refinery systems, media systems, financial systems, data-driven prognostics systems, computer network systems, or communication systems.

14. The method of claim 5, wherein the asset is associated with aviation systems, engine systems, aircraft systems, automobile systems, water craft systems, industrial equipment systems, industrial systems, manufacturing systems, factory systems, energy management systems, power grid systems, water supply systems, transportation systems, healthcare systems, refinery systems, media systems, financial systems, data-driven prognostics systems, computer network systems, or communication systems.

15. The computer readable storage device of claim 9, wherein the asset is associated with aviation systems, engine systems, aircraft systems, automobile systems, water craft systems, industrial equipment systems, industrial systems, manufacturing systems, factory systems, energy management systems, power grid systems, water supply systems, transportation systems, healthcare systems, refinery systems, media systems, financial systems, data-driven prognostics systems, computer network systems, or communication systems.

* * * * *